US007163777B2

(12) United States Patent
Ray et al.

(10) Patent No.: US 7,163,777 B2
(45) Date of Patent: Jan. 16, 2007

(54) THERMALLY SENSITIVE IMAGEABLE ELEMENT

(75) Inventors: Kevin Barry Ray, Fort Collins, CO (US); Anthony Paul Kitson, Evans, CO (US); John Kalamen, Loveland, CO (US)

(73) Assignee: Eastman Kodak Company, Rochester, NY (US)

( * ) Notice: Subject to any disclaimer, the term of this patent is extended or adjusted under 35 U.S.C. 154(b) by 44 days.

(21) Appl. No.: 10/802,533

(22) Filed: Mar. 17, 2004

(65) Prior Publication Data

US 2004/0234892 A1 Nov. 25, 2004

Related U.S. Application Data

(63) Continuation-in-part of application No. 10/694,205, filed on Oct. 27, 2003, now abandoned, which is a continuation of application No. 09/948,182, filed on Sep. 7, 2001, now Pat. No. 6,673,514.

(51) Int. Cl.
*G03F 7/004* (2006.01)

(52) U.S. Cl. ................ 430/270.1; 430/302; 430/271.1; 430/273.1; 430/281.1; 430/283.1; 430/286.1; 430/944; 430/945; 560/130

(58) Field of Classification Search ............. 430/270.1, 430/302, 303, 271.1, 273.1, 281.1, 284.1, 430/286.1, 944, 945
See application file for complete search history.

(56) References Cited

U.S. PATENT DOCUMENTS

| | | | | |
|---|---|---|---|---|
| 4,996,136 | A * | 2/1991 | Houlihan et al. | 430/313 |
| 6,111,133 | A * | 8/2000 | Houlihan | 560/130 |
| 6,143,464 | A | 11/2000 | Kawauchi | |
| 6,294,311 | B1 | 9/2001 | Shimazu et al. | |
| 6,352,811 | B1 | 3/2002 | Patel et al. | |
| 6,352,812 | B1 | 3/2002 | Shimazu et al. | |
| 6,358,669 | B1 | 3/2002 | Savariar-Hauck et al. | |
| 6,475,692 | B1 | 11/2002 | Jarek et al. | |
| 6,525,152 | B1 | 2/2003 | Jarek | |
| 6,534,238 | B1 * | 3/2003 | Savariar-Hauck et al. | 430/270.1 |
| 6,555,291 | B1 | 4/2003 | Hauck | |
| 6,645,689 | B1 | 11/2003 | Jarek | |
| 2004/0067432 | A1 | 4/2004 | Kitson et al. | |

FOREIGN PATENT DOCUMENTS

| | | | |
|---|---|---|---|
| EP | 0908307 | A2 | 4/1999 |
| EP | 0908784 | A1 | 4/1999 |
| EP | 0984622 | A2 | 3/2000 |
| EP | 1023994 | A1 | 8/2000 |
| EP | 0864420 | B1 | 5/2001 |
| EP | 0908305 | B1 | 11/2001 |
| EP | 0950518 | B1 | 1/2002 |
| EP | 0940266 | B1 | 6/2002 |
| EP | 0960728 | B1 | 5/2003 |
| JP | 11-119419 | | 4/1999 |
| JP | 2000-330265 | | 11/2000 |
| JP | 2001-042509 | | 2/2001 |
| JP | 2001-042510 | | 2/2001 |
| WO | WO 01/96119 | A1 | 12/2001 |
| WO | WO 02/33491 | A2 | 4/2002 |
| WO | WO 2003/023515 | | 3/2003 |

OTHER PUBLICATIONS

U.S. Appl. No. 10/641,888, filed Aug. 14, 2003, Kitson et al.
PCT International Search Report for PCT/US2005/008408, mailed Jun. 15, 2005 (4 pages).

* cited by examiner

*Primary Examiner*—Amanda Walke
(74) *Attorney, Agent, or Firm*—J. Lanny Tucker

(57) ABSTRACT

The present invention provides an imageable element including a substrate, a first layer applied to the substrate and a second layer applied to the first layer. The first layer may contain polymeric material and a radiation absorbing compound. The second layer may contain a hydroxyl group-containing polymer that includes a heat-labile moiety.

23 Claims, No Drawings

THERMALLY SENSITIVE IMAGEABLE ELEMENT

CROSS REFERENCE TO RELATED APPLICATIONS

This application is a continuation-in-part of U.S. application Ser. No. 10/694,205, filed on Oct. 27, 2003, now abndoned which is a continuation of U.S. application Ser. No. 09/948,182, filed on Sep. 7, 2001, which is now issued as U.S. Pat. No. 6,673,514. The entire contents of these applications are hereby incorporated by reference.

BACKGROUND OF THE INVENTION

Imageable elements, such as lithographic printing form precursors, electronic part precursors and mask precursors typically are formed by coating a film-forming, radiation absorbing compound on to a substrate. Conventional radiation absorbing compounds include photosensitive components dispersed within a polymeric binder. After a portion of the radiation absorbing compound is exposed (commonly referred to as imagewise exposure), the exposed portion becomes either more soluble or less soluble in a developer than an unexposed portion of the radiation absorbing compound. In a positive working imageable element, the exposed regions of the radiation absorbing compound become more soluble in a developer than non-exposed regions. Conversely, in a negative working plate, the exposed regions become less soluble in a developer than non-exposed regions. In each instance, it is the undeveloped areas that remain on the plate, while the developed regions reveal the substrate's hydrophilic surface.

Radiation absorbing compounds that respond to infrared (IR) radiation have recently become of interest. In these systems, the radiation absorbing compounds contain IR absorbers that convert IR radiation to heat. A suitable IR radiation source is an IR laser digitally controlled to produce the required pattern of irradiated or heated areas. These compositions are suitable for advanced "Computer-to-Plate" (CTP) techniques. Some IR compositions, which are not sensitive to ultra-violet or visible radiation, offer the advantage of not needing to be handled in a dark room, or under ultra-violet safelighting conditions. Rather, these compositions can be handled in ordinary light.

The radiation absorbing compounds must balance several properties needed for imaging. These properties include suitable adhesion to the substrate, suitable development after imaging, and suitable resolution. Two approaches have been pursued to reach a proper balance of properties in these materials. The first approach concentrates on improving the quality of the photosensitive components of the materials. The second approach involves improving the quality of the polymeric binder that controls the physical and mechanical properties of the material. The second approach has been the source of significant research and innovation because the behavior of the radiation absorbing compound in the imaging, developing and printing processes, as well as the shelf life and durability of the imageable element are related to the choice of binder material.

Some IR absorbing compounds have suitable adherence to substrates. Other IR absorbing compounds exhibit suitable photosensitivity under conventional imaging conditions. Still other IR absorbing compounds are able to withstand the extended exposure and development steps required in the productions of certain imageable elements, particularly printing plates. Other IR absorbing compounds have sufficient developer resistance after imaging. Further yet, certain polymer binders have suitable resistance to the mechanical stress that imageable elements are subjected to, as well as chemicals used to clean and treat finished plates. Nonetheless, an IR absorbing compound that exhibits all of these properties is currently the focus of ongoing research.

SUMMARY OF THE INVENTION

In one embodiment, the present invention provides a positive working imageable element that includes a substrate, a first layer applied to the substrate that contains a polymeric material, and a second layer applied to the first layer containing a hydroxyl group-containing polymer and a heat-labile moiety having at least one of the following formulae:

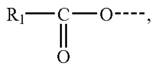
,
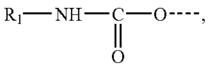
, or
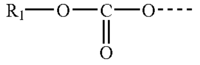

in which $R_1$ is an alkyl group, an arylalkyl group, an aryl group, an alkenyl group or a silyl group.

The polymeric material of the first layer may include at least one copolymer including units of N-phenylmaleimide, methacrylic acid, or methacrylamide. It may also include a second copolymer including units of N-phenylmaleimide, methacrylamide, or acrylonitrile. The second copolymer may also include units of a component represented by Formulae (1) or (2):

(1)

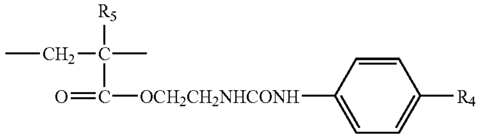

(2)

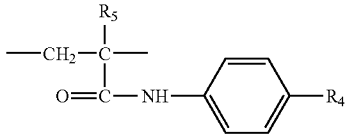

or units of both components, in which $R_4$ is OH, COOH, or $SO_2NH_2$; and $R_5$ is hydrogen, halogen or a $C_1$–$C_{12}$ alkyl group. The first layer may also include a resin having activated methylol or activated alkylated methylol groups, such as a resole resin.

The hydroxyl group-containing polymer of the second layer may be a phenolic resin such as a novolak resin. The heat-labile moieties may be a pendant group on the hydroxyl group-containing polymer and may include 5 mol % to 50 mol % of the hydroxyl group-containing polymer, leaving other hydroxyl groups free of heat-labile moeties.

In another embodiment, the invention provides a method of forming a printing plate precursor that includes applying the first layer reported above onto the substrate, and then applying the second layer reported above onto the first layer. The resulting printing plate precursor may then be exposed and developed to form a printing plate.

DETAILED DESCRIPTION OF THE INVENTION

In one embodiment, the present invention provides an imageable element including a substrate, a first layer applied to the substrate and a second layer applied to the first layer.

The substrate of the imageable element may be constructed from a variety of suitable materials including metals, alloys, papers, coated papers and polymeric materials. In one embodiment, the substrate may include a metal surface. Suitable metals include aluminium, zinc, titanium, and/or alloys such as brass and steel. For example, the substrate may be an aluminium plate which has been grained and/or anodized in a conventional manner. Alternatively, the substrate may be formed from a polymeric material or a treated paper commonly used in the photography industry. A particularly suitable polymeric material is polyethylene terephthalate which has been subbed to render its surface hydrophilic. A coated paper which has been corona discharge treated may also be used.

The first layer may include one or more copolymers. A number of suitable copolymers and copolymer mixtures may be included in the first layer. In one embodiment, the copolymer includes units of N-phenylmaleimide, methacrylamide, and methacrylic acid. This copolymer may include, for example, between about 25 mol % and about 75 mol %, more particularly between about 35 mol % and about 60 mol % of N-phenylmaleimide; between about 10 mol % and about 50 mol %, more particularly between about 15 mol % and about 40 mol % of methacrylamide; and between about 5 mol % and about 30 mol %, more particularly between about 10 mol % and about 30 mol % of methacrylic acid. Similar copolymers are reported in U.S. Pat. No. 6,294,311 to Shimazu and U.S. Pat. No. 6,528,228 to Savariar-Hauck, the disclosures of which are incorporated herein by reference.

The copolymer may also include units of N-phenylmaleimide, methacrylamide, acrylonitrile, and units of at least one component represented by Formulae (1) or (2):

(1)

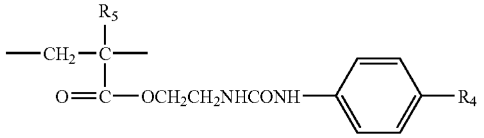

(2)

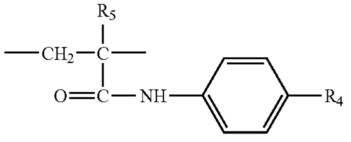

or units of both components, in which $R_4$ is OH, COOH, or $SO_2NH_2$; and $R_5$ is hydrogen, halogen or $C_1$–$C_{12}$ alkyl group.

For example, the copolymer used in the first layer may include between about 1 wt % and about 30 wt %, more particularly between about 3 wt % and about 20 wt %, even more particularly about 5 wt % N-phenylmaleimide; between about 1 wt % and about 30 wt %, more particularly between about 5 wt % and about 20 wt %, even more particularly about 10 wt % methacrylamide; between about 20 wt % and about 75 wt %, more particularly between about 35 wt % and about 60 wt %, even more particularly about 45 wt % acrylonitrile; and between about 20 wt % and about 75 wt %, more particularly between about 35 wt % and about 60 wt %, even more particularly about 40 wt % of a component represented by Formula (1).

In another embodiment, the copolymer used in the first layer may include between about 1 wt % and about 30 wt %, more particularly between about 3 wt % and about 20 wt %, even more particularly about 5 wt % N-phenylmaleimide; between about 1 wt % and about 30 wt %, more particularly between about 5 wt % and about 20 wt %, even more particularly about 10 wt % methacrylamide; between about 20 wt % and about 75 wt %, more particularly between about 35 wt % and about 60 wt %, even more particularly about 48 wt % acrylonitrile; between about 20 wt % and about 75 wt %, more particularly between about 35 wt % and about 60 wt %, even more particularly about 31 wt % of a component represented by Formula (1); and between about 1 wt % and about 30 wt %, more particularly between about 3 wt % and about 20 wt %, even more particularly 6 wt % of a component represented by Formula (2).

The copolymers may be prepared by conventional methods, such as free radical polymerization, which are reported, for example, in Chapters 20 and 21, of *Macromolecules*, Vol. 2, 2nd Ed., H. G. Elias, Plenum, N.Y., 1984. Useful free radical initiators for use in embodiments of the present invention include peroxides such as benzoyl peroxide (BPO), hydroperoxides such as cumyl hydroperoxide and azo compounds such as 2,2'-azobis(isobutyronitrile) (AIBN). Suitable solvents include liquids that are inert to the reactants and which will not otherwise adversely affect the reaction. Typical solvents include, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof.

The first layer may also include a resin or resins having activated methylol and/or activated alkylated methylol groups. Suitable resins include, for example, resole resins and their alkylated analogs; methylol melamine resins and their alkylated analogs, for example melamine-formaldehyde resins; methylol glycoluril resins and alkylated analogs, for example, glycoluril-formaldehyde resins; thiourea-formaldehyde resins; guanamine-formaldehyde resins; and benzoguanamine-formaldehyde resins. Commercially available melamine-formaldehyde resins and glycoluril-formaldehyde resins include, for example, CYMEL® resins (Dyno Cyanamid Co., Ltd.) and NIKALAC® resins (Sanwa Chemical Co., Ltd.).

In a particular embodiment, the resin or resins having activated methylol and/or activated alkylated methylol groups is a resole resin or a mixture of resole resins, which may be prepared by reaction of a phenol with an aldehyde under basic conditions using an excess of phenol. Aldehyde: phenol ratios of between about 1:1 and about 3:1, and a basic catalyst, may be used to form resole resins. Commercially available resole resins include, for example, GP649D99 resole (Georgia Pacific) and BKS-5928 resole resin (Union Carbide). When present, a resole resin may constitute between about 7 wt % and about 15 wt %, more particularly between about 8 wt % and about 12 wt %, even more particularly about 10 wt % of the first layer, based on the total weight of the first layer.

Although a radiation absorbing compound may be included in either the first layer or the second layer, in one embodiment the radiation absorbing compound is included in the first layer. A wide variety of radiation absorbing compounds may be utilized in embodiments of the present invention.

In one embodiment, the radiation absorbing compound may be a pigment, for example a black body or broad band radiation absorber. For example, the pigment may be able to absorb electromagnetic radiation and convert it to heat over a range of wavelengths exceeding 200 nm, more particularly exceeding 400 nm. Examples of suitable pigments include carbon black, lamp black, channel black, furnace black, iron blue, insoluble azo pigments, azo lake pigments, condensed azo pigments, chelate azo pigments, phthalocyanine based pigments, anthraquinone based pigments, perylene or perynone based pigments, thioindigo based pigments, quinacridone based pigments, dioxazine based pigments, vat dyeing lake pigments, azine pigments, nitroso pigments, and nitro pigments.

Particularly suitable pigments include carbon black, lamp black, channel black, furnace black and iron blue.

Alternatively, the radiation absorbing compound may be a dye. Dyes are generally narrow band absorbers able to absorb electromagnetic radiation and convert it to heat only over a range of wavelengths typically not exceeding 100 nm. The dyes may be selected by taking into consideration the wavelength of the radiation which will be used for imaging. Suitable dyes include squarylium based dyes, merocyanine based dyes, cyanine based dyes, indolizine based dyes, pyrylium based dyes and metal dithioline based dyes.

Specific examples of suitable dyes include:

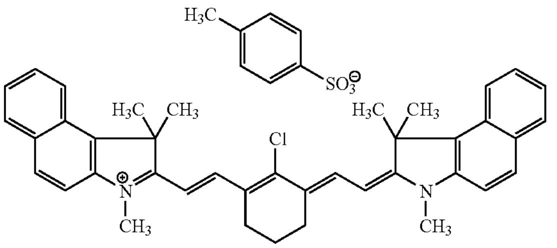

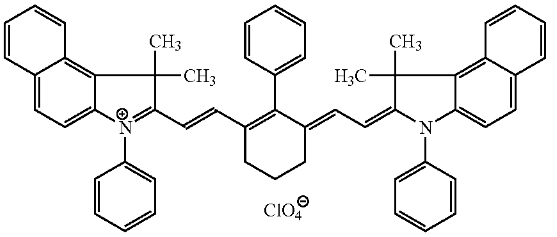

and

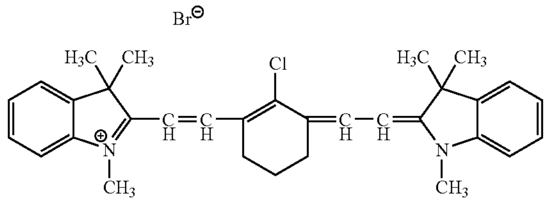

In one embodiment, the radiation absorbing compound may constitute at least about 0.25 wt %, more particularly at least about 0.5 wt %, even more particularly at least about 1.1 wt %, and even more particularly at least about 2 wt % of the composition. In another embodiment, the radiation absorbing compound may constitute up to about 25 wt %, more particularly up to about 20 wt %, even more particularly up to about 15 wt % and even more particularly up to about 10 wt % of the composition. In yet another embodiment, the radiation absorbing compound may range from about 0.25 wt % to about 15 wt % of the composition, more particularly about 0.5 wt % to about 10 wt %. More than one radiation absorbing compound may be used. In certain embodiments, the radiation absorbing compounds may also reduce the developer solubility of the hydroxyl group-containing polymer in the second layer.

The first layer may also include one or more colorant compounds or moieties to differentiate the regions of the imageable element that are exposed and regions that are not exposed. The colorant compounds or moieties may also be included in the second layer or in both layers. Colorant compounds or moieties may be, quaternized nitrogen-containing triarylmethane dyes, including Crystal Violet (CI basic violet 3), Victoria Blue and Ethyl Violet; quaternized heterocyclic compounds, including Monazoline C, Monazoline O, Monazoline CY and Monazoline T, all of which are manufactured by Mona Industries, quinolinium compounds, such as 1-ethyl-2-methyl quinolinium iodide and 1-ethyl-4-methyl quinolinium iodide, benzothiazolium iodide, and pyridinium compounds such as cetylpyridinium bromide, ethyl viologen dibromide and fluoropyridinium tetrafluoroborate.

Other compounds or moieties useful as colorants include Methylene Blue (CI Basic blue 9), polymethine dyes, cyanine dyes, Acidic Orange (CI Solvent orange 15) and a dye having the cation:

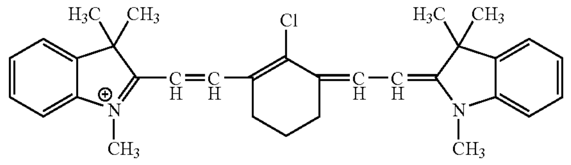

Useful quinolinium or benzothiazolium compounds include cationic cyanine dyes, such as Quinoldine Blue and 3-ethyl-2-[3-(3-ethyl-2-(3H)-benzothiazolyidene)-2-methyl-1-propenyl]benzothiazolium iodide, and the compound having a cation of formula:

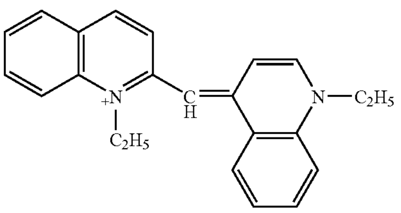

Suitably, the colorant may include additional functional groups which act as infrared absorbing groups.

The first layer may contain other additives such as stabilizing additives, additional inert polymeric binders, surfactants, dispersing agents, biocides, and other additives commonly included in positive working coatings. Examples of suitable dispersing agents include cationic, anionic, amphoteric and non-ionic surfactants. Particular examples include perfluoroalkyl, alkylphenyl, or polysiloxane surfactants. Suitable polysiloxane surfactants include polyether/polysiloxane copolymer, alkyl-aryl modified methyl-polysiloxane and acylated polysiloxane. Other suitable surfactants include sorbitan tristearate, sorbitan monopalmitate, sorbitan trioleate, mono glyceride stearate, polyoxyethylene nonylphenyl ether, alkyl di (aminoethyl) glycine, alkyl polyaminoethylglycine hydrochloride, 2-alkyl-n-carboxyethyl-N-hydroxyethyl imidazolinium betaine, and N-tetradecyl-N,N-substituted betaine. Additional surfactants include alkylated surfactants, fluorosurfactants and siliconated surfactants. Examples of these surfactants include sodium dodecylsulfate, isopropylamine salts of an alkylarylsulfonate, sodium dioctyl succinate, sodium methyl cocoyl taurate, dodecylbenzene sulfonate, alkyl ether phosphoric acid, N-dodecylamine, dicocoamine, 1-aminoethyl-2-alkylimidazoline, 1-hydroxyethyl-2-alkylimidazoline, cocoalkyl trimethyl quaternary ammonium chloride, polyethylene tricecyl ether phosphate and the like. Examples of suitable fluorosurfactants also include ZONYL FSD, ZONYL FSA, ZONYL FSP, ZONYL FSJ, ZONYL FS-62, ZONYL FSK, ZONYL FSO, ZONYL FS-300, ZONYL FSN, and OLIN 10G, all of which are commercially available from E.I. Du Pont De Nemours & Co. Additional examples of suitable fluorosurfactants include FLUORAD brand surfactants, which are commercially available from 3M, St. Paul, Minn. Further examples of suitable surfactants include polyether modified poly-dimethyl-siloxane, silicone glycol, polyether modified dimethyl-polysiloxane copolymer, and polyether-polyester modified hydroxy functional polydimethyl-siloxane.

When a surfactant or dispersing agent is present in the first layer, it typically constitutes between about 0.05 wt % and about 1 wt %, more particularly between about 0.1 wt % and about 0.6 wt %, even more particularly between about 0.2 wt % and 0.5 wt % of the first layer.

In a particular embodiment, the first layer may include a resole resin, a radiation absorbing compound, an optional surfactant, between about 40 wt % and about 80 wt %, more particularly between about 50 wt % and about 70 wt % of a copolymer containing units of N-phenylmaleimide, methacrylic acid, and methacrylamide, and between about 5 wt % and about 25 wt %, more particularly between about 10 wt % and about 20 wt % of a copolymer containing units of N-phenylmaleimide, methacrylamide, acrylonitrile, and units of components represented by the formulae (1) or (2) or units of both components.

The second layer includes a hydroxyl group-containing polymer having heat labile moieties. The hydroxyl group-containing polymer may be a phenolic resin or copolymer thereof, such as poly(p-hydroxystyrenes), poly p-hydroxy-α-methyl styrenes and novolaks. Other suitable hydroxyl group-containing polymers include poly-4-hydroxystyrene; copolymers of 4-hydroxystrene, for example with 3-methyl-4-hydroxystrene or 4-methoxystrene; copolymers of methacrylic acid, for example with styrene; copolymers of maleimide, for example with styrene; hydroxy or carboxy functionalized celluloses; dialkylmaleimide esters; copolymers of maleic anhydride, for example with styrene; and partially hydrolysed polymers of maleic anhydride.

Particularly useful phenolic resins in this invention include the condensation products from the interaction between phenol, C-alkyl substituted phenols (such as cresols, xylenols, p-phenylphenol, nonyl phenols and p-tert-butyl-phenol), diphenols (such as bisphenol-A and bisphenol-A (2,2-bis(4-hydroxyphenyl)propane)) and aldehydes and ketones (such as formaldehyde, chloral, acetaldehyde, furfuraldehyde, and acetone). The molar ratio of the reactants used in the preparation of phenolic resins may determine their molecular structure and therefore the physical properties of the resin. For example, an aldehyde:phenol ratio between 0.5:1 and 1:1, particularly between 0.5:1 and 0.8:1, and an acid catalyst may be used to prepare novolak resins.

A particularly suitable resin is a novolak resin. Examples of suitable novolak resins may have the following general structure:

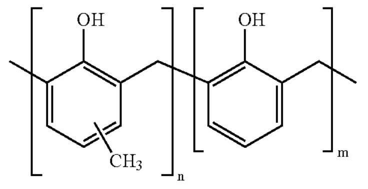

where the ratio n:m is in the range of 1:20 to 20:1, more particularly in the range of 3:1 to 1:3. In one embodiment, n=m. However, in other embodiments n or m may be zero. Suitable novolak resins may have a molecular weight in the range of about 500–20,000, more particularly in the range of about 1000–15,000, even more particularly in the range of about 2500–10,000.

Alternatively, copolymers of poly(vinylphenol), such as PVP/MMA having a ratio of 50:50, PVP/2-HEMA having a ratio of 50:50, PVP/n-BuA having a ratio of 50:50, and PVP/St having ratios of 15:85, 50:50, and 70:30 may be suitable.

In one embodiment, the hydroxyl group-containing polymer includes a heat-labile moiety having at least one of the following formulae:

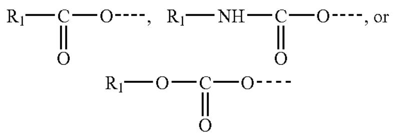

in which $R_1$ is an alkyl group, an arylalkyl group, an aryl group, an alkenyl group or a silyl group. The alkyl group may be a $C_1$–$C_{12}$ alkyl group, more particularly $C_1$–$C_6$ alkyl group, and event more particularly a $C_1$–$C_4$ alkyl group. In another embodiment, $R_1$ may be

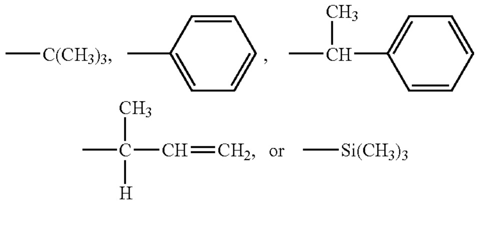

An alkyl group may be branched (for example t-butyl) or straight chain (for example n-butyl). In a particular embodiment, $R_1$ is $C(CH_3)_3$.

The heat-labile moiety may be attached to the hydroxyl group-containing polymer as a pendant group via the hydroxyl groups. However, not all of the hydroxyl groups have to be functionalized with the heat-labile moiety. Thus, the polymer may include both pendent heat-labile moieties and free hydroxyl groups.

Particularly suitable hydroxyl group-containing polymers having pendent heat-labile groups include polymers having the following units:

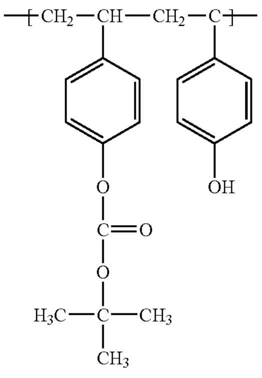

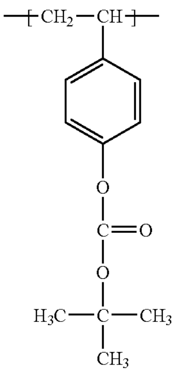

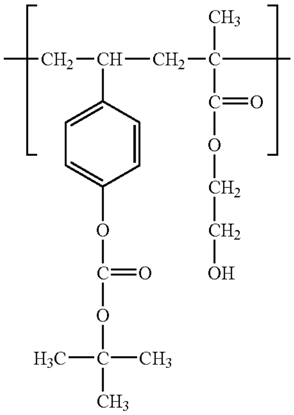

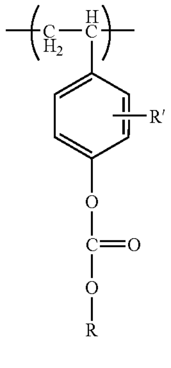

or

-continued

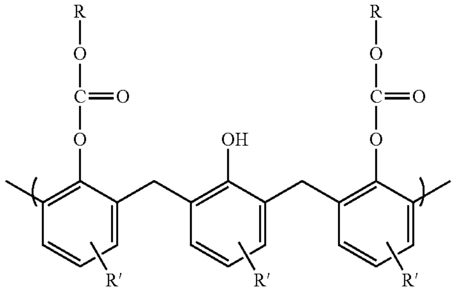

The amount of the heat-labile moiety may be suitably in a range from about 5 mol % to about 50 mol % of the hydroxyl group-containing polymer. More particularly, the range is from about 10 mol % to about 30 mol %.

In certain embodiments, there may be more than one hydroxyl group-containing polymer present and each hydroxyl group-containing polymer may be a discrete heat-labile moiety having one of the formulae reported above.

Optionally, the second layer may also include a surfactant or other suitable dispersing agent as described above. The second layer may contain other additives such as stabilizing additives, additional inert polymeric binders, biocides, and other additives commonly included in positive working coatings.

The second layer may also include colorants, for example, the colorants described above. Some colorants may reduce the developer solubility of the hydroxyl group-containing polymer.

In certain embodiments, second layer may be substantially free of radiation absorbing compound. In these embodiments, the interaction between the first and second layers may result in some radiation absorbing compound diffusing from the first layer into the second layer.

In a particular embodiment, the second layer may contain a novolak resin with about 5 mol % to about 50 mol %, more particularly about 10 mol % to about 30 mol %, of a pendant heat-labile moiety having one of the formulae reported herein, a colorant compound, and a surfactant.

The first layer may be coated on to the substrate by dissolving and/or dispersing the components included in the first layer in a suitable solvent. A particularly suitable solvent may include, for example, a solution of methyl ethyl ketone, 1-methoxypropan-2-ol, butyrolacetone, and water in a ratio of 65:15:10:10 (w:w). The first layer may be coated on a suitable substrate using, for example, a wire wound bar. The first layer may then be dried at elevated temperatures, for example, at 135° C. for 35 seconds.

The first layer adheres suitably to the substrate and provides resistance to solvents and common printing room chemicals, such as fountain solution, inks, plate cleaning agents, rejuvenators, and rubber blanket washing agents, as well as to alcohol substitutes, which are used in fountain solutions. The first layer also is resistant to rinsing agents with a high content of esters, ethers, and ketones, which are used with ultraviolet curable inks.

The second layer may be coated onto the first layer by dissolving the components included in the second layer in a suitable solvent. A particularly suitable solvent may include, for example, a solution of 1-methoxy-2-propyl acetate and DEK in a ratio of 8:92 (w:w). A suitable solvent may be one that does not dissolve or disperse the polymeric material used in the first layer so that the second layer may be coated over the first layer without dissolving the first layer. The second layer may then be coated onto the first layer using, for example, a wire wound bar. The second layer may be dried at elevated temperatures, for example, at 135° C. for 35 seconds.

The imageable element may then be imagewise exposed to radiation such that exposed portions are more developable in a suitable developer liquid then unexposed portions. In certain embodiments the element may be imagewise exposed with a laser or an array of lasers emitting modulated near infrared or infrared radiation in a wavelength region that is absorbed by the imageable element. The electromagnetic radiation employed for imagewise exposure has a wavelength of at least about 600 nm, more particularly at least about 700 nm, even more particularly at least about 750 nm, even more particularly at least about 800 nm. Suitably, the radiation has a wavelength of not more than about 1400 nm, more particularly not more than 1300 nm, even more particularly not more than 1200 nm and even more particularly not more than 1150 nm. For example, imaging may be carried out with a laser emitting at about 830 nm, about 1056 nm, or about 1064 nm.

The radiation may be delivered by a laser under digital control. Examples of suitable lasers which may be used to expose the element for the method of the present invention include semiconductor diode lasers emitting radiation at between 600 nm and 1400 nm, more particularly between 700 nm and 1200 nm. In a particular embodiment, the Nd YAG laser is used in the Barco Crescent 42/T thermal image setter which emits at 1064 nm. In another embodiment, the diode laser is used in the Creo Trendsetter thermal image setter, which emits at 830 nm. Other suitable commercially available imaging devices include image setters such as the CREO® Trendsetter (CREO, Burnaby, British Columbia, Canada), the Screen PlateRite Model 4300, Model 8600, and Model 8800 (Screen, Rolling Meadows, Chicago, Ill., USA), and the Gerber Crescent 42T (Gerber Systems, South Windsor, Conn., USA). However, any laser of sufficient imaging power and whose radiation is absorbed by the coating may be used.

Suitably, imaging is effected using an imaging energy of no more than about 600 $mJcm^{-2}$, more particularly no more than about 500 $mJcm^{-2}$, even more particularly no more than about 400 $mJcm^{-2}$. Suitably, imaging may be effected using an imaging energy of at least about 35 $mJcm^{-2}$, more particularly at least about 75 $mJcm^{-2}$, and even more particularly at least 100 $mJcm^{-2}$.

After imaging, the first and second layers are removed by a developer in the imaged regions to reveal the underlying hydrophilic surface of the substrate. Development is carried out for a sufficient amount of time to remove the imaged regions of the first and second layers without removing substantial amounts of the unimaged regions of the second layer.

High pH, or alkaline, developers have been used for imaged multi-layer positive-working imageable elements. A high pH developer typically has a pH of at least about 11, more particularly at least about 12, even more particularly from about 12 to about 14. High pH developers comprise at least one alkali metal silicate, such as lithium silicate, sodium silicate, and/or potassium silicate. A mixture of alkali metal silicates may be used. High pH developers may include, for example, an alkali metal silicate having a alkali metal silicate to $M_2O$ weight ratio of at least about 0.3, in which M is the alkali metal. In one embodiment, the ratio may be between about 0.3 and about 1.2. More particularly, the ratio is between about 0.6 and about 1.1, even more particularly, between about 0.7 and about 1.0.

The amount of alkali metal silicate in the high pH developer is typically at least 20 g of alkali metal silicate per 1000 g of developer (that is, at least about 2 wt %), more particularly from about 20 g to 80 g of alkali metal silicate per 1000 g of developer (that is, about 2 wt % to about 8 wt %). Even more particularly, it is about 40 g to 65 g of $SiO_2$ per 1000 g of developer (that is, about 4 wt % to about 6.5 wt %). In addition to the alkali metal silicate, alkalinity may be provided by a suitable concentration of any suitable base, such as, for example, ammonium hydroxide, sodium hydroxide, lithium hydroxide, and/or potassium hydroxide. A particular base is potassium hydroxide. Optional components of high pH developers are anionic, nonionic and amphoteric surfactants (up to 3% on the total composition weight), biocides (antimicrobial and/or antifungal agents), antifoaming agents or chelating agents (such as alkali gluconates), and thickening agents (water soluble or water dispersible polyhydroxy compounds such as glycerin or polyethylene glycol). However, these developers typically do not contain organic solvents. Typical commercially available high pH developers include: Goldstar™ Developer, 4030 Developer, PD-1 Developer, and MX 1813 Developer, all available from Kodak Polychrome Graphics, Norwalk, Conn.

Imaged multi-layer positive working elements may also be developed in another solvent-containing developer. These solvent-containing developers have conventionally been used to develop negative-working rather than positive-working imageable elements, and are thus known as negative developers. Solvent-containing alkaline developers typically have a pH below about 10.5, particularly below 10.2 (measured at 25° C.). Solvent-containing developers comprise water and an organic solvent or a mixture of organic solvents. They are typically free of silicates, alkali metal hydroxides, and mixtures of silicates and alkali metal hydroxides. The developer may be a single phase. Thus, the organic solvent or mixture of organic solvents may be either miscible with water or sufficiently soluble in the developer so that phase separation does not occur. Optional components include anionic, nonionic and amphoteric surfactants (up to 3% on the total composition weight), and biocides (antimicrobial and/or antifungal agents). The following solvents and mixtures thereof are suitable for use in solvent-containing developers: the reaction products of phenol with ethylene oxide (phenol ethoxylates) and with propylene oxide (phenol propoxylates), such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and propylene glycol with alkyl groups having six or fewer carbon atoms, such as 2-ethoxyethanol, 2-(2-ethoxy)ethoxyethanol, and 2-butoxyethanol. The developer typically includes between about 0.5 wt % and about 15 wt %, more particularly between about 3 wt % and about 5 wt %, of the organic solvent or solvents, based on the weight of the developer. Commercially available solvent based developers include AQUA-IMAGE® Developer, PRONEG® D501 Developer, MX 1725 Developer, MX 1587 Developer, 956 Developer, 955 Developer, and SP200, all available from Kodak Polychrome Graphics, Norwalk, Conn., USA.

The imaged elements may be developed in an immersion processor or a spray on processor. Commercially available spray on processors include the 85 NS (Kodak Polychrome Graphics). Commercially available immersion processors include the Mercury™ Mark V processor (Kodak Polychrome Graphics); the Global Graphics Titanium processor (Global Graphics, Trenton, N.J., USA); and the Glunz and Jensen Quartz 85 processor (Glunz and Jensen, Elkwood, Va., USA).

The imageable element of the present invention may be utilized, for example, as a printing plate precursor, an electronic part precursor or a mask precursor. In one embodiment, the present invention is a precursor to a printed circuit board (PCB). Alternatively the imageable element may be a precursor to a letterpress printing form, or a decorative article. A decorative article, for example, may be an article which is selectively etched to leave recesses in the surface of the article, which recesses may then be inlaid with decorative materials such as colored resins. An example of a decorative article is a damascene.

EXAMPLES

N-13 solution: novolak resin, 100% meta-cresol, MW 13000, 33% solids in acetone, manufactured by Eastman Kodak, Rochester, N.Y.

N-13: novolak resin, 100% meta-cresol, MW 13000, manufactured by Eastman Kodak, Rochester, N.Y.

Di-t-butyldicarbonate and potassium carbonate: supplied by Aldrich Chemical Company, Milwaukee, Wis.

18-crown-6: a 1,4,7,10,13,16-Hexaoxacyclooctadecane as supplied by Aldrich Chemical Company, Milwaukee, Wis.

Substrate A: An electrograined and anodized 0.3 gauge aluminum sheet containing a phosphate fluoride interlayer. The substrate was made by the following procedure. An aluminum surface is first degreased, etched and subjected to a desmut step (removal of reaction products of aluminum and the etchant). The plate is then electrograined using an AC current of 30–60 A/cm$^2$ in a HCl solution (10 g/liter) for 30 seconds at 25° C., followed by a post-etching alkaline wash and a desmut step. The grained plate is then anodized using DC current of about 8 A/cm$^2$ for 30 seconds in a $H_2SO_4$ solution (280 g/liter) at 30° C. The anodized substrate is then treated in a process solution containing sodium dihydrogen phosphate and sodium fluoride at 70° C. for a dwell time of 60 seconds. This was followed by a water rinse and drying. The sodium dihydrogen phosphate and sodium fluoride are deposited as a layer to provide a surface coverage of about 500 mg/M$^2$.

IR dye A:

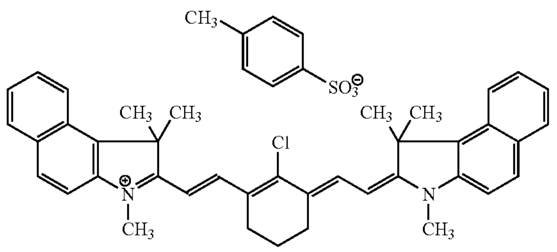

JK-67: A copolymer including units of N-phenylmaleimide (45 mol %), methacrylamide (35 mol %) and methacrylic acid (20 mol %).

EUV-5: A copolymer including units of N-phenylmaleimide (5 wt %), methacrylamide (10 wt %), acrylonitrile (48 wt %) and 31 wt % of:

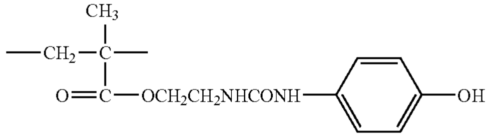

and 6 wt % of:

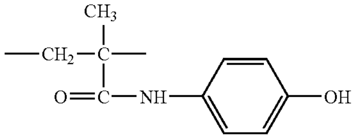

RAR-62: A copolymer including units of N-phenylmaleimide (5 wt %), methacrylamide (10 wt %), acrylonitrile (45 wt %) and 40 wt % of:

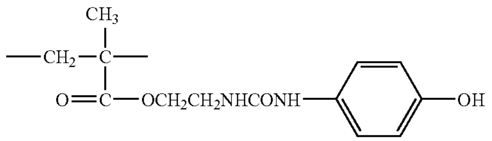

GP649D99: a resole resin as supplied by Georgia-Pacific, Atlanta, Ga.

BYK307: a polyethoxylated dimethylpolysiloxane copolymer as supplied by BYK Chemie, Wallingford, Conn.

Ethyl violet: C.I. 42600; CAS 2390-59-2 ($\lambda_{max}$=596 nm) $[(p-(CH_3CH_2)_2NC_6H_4)_3C^{+}Cl^{-}]$ as supplied by Aldrich Chemical Company, Milwaukee, Wis.

TN-13 functionalized novolak resin: The resin was made by the following procedure. N-13 (24 g, 199.75 millimoles) was added to acetone (66 g), stirred, and cooled to 10° C. in ice/water bath. P-toluene sulfonyl chloride (3.8 g, 20.02 millimoles) was added over a one minute period at 10° C. Triethylamine (2.0 g, 19.63 millimoles) was added over a two minute period at 10° C. The solution was stirred for 10 minutes at less than 15° C. Acetic acid (0.5 g, 8.33 millimoles) was added over a 10 second period at 10° C., and then stirred for 15 minutes. In a separate container, water/ice (160 g) and acetic acid (1.2 g, 20.02 millimoles) were mixed and stirred for 1 minute at 15° C. The acidified water/ice mix was added to the reaction mixture over several minutes and the solution was stirred for 5 additional minutes. The temperature was kept below 15° C. A tacky gooey mass was formed. The supernatant was decanted. Acetone (354 g) was added to the mass and stirred until a clear solution was obtained. A water/ice mixture (460 g) was slowly added to the reaction mixture, until the reaction mixture remained cloudy. The solution was stirred for 2 minutes. The resulting solution was labelled the "acetone dope." Ice (460 g), water (460 g) and acetic acid (0.5 g), were mixed and stirred for 1 minute. The acetone dope (25%) was added to the acidified water/ice mixture and stirred for 20 minutes. The contents were allowed to settle and the supernatant was decanted. The process was repeated three further times for the remaining acetone dope. All damp polymer fractions were combined and washed in water (460 g). The water washing procedure was repeated. The yield was about 88% of the theoretical yield.

Goldstar developer: Sodium metasilicate based aqueous alkaline developer as supplied by Kodak Polychrome Graphics, Norwalk, Conn.

T-183 developer: 200 parts of Goldstar developer, 4 parts of polyethylene glycol (PEG) 1449, 1 part of sodium metasilicate pentahydrate and 0.5 part of Triton H-22 surfactant (phosphate ester surfactant).

PHS (novolak grade): poly 4-hydroxystyrene, MW 4500 as supplied by Triquest LP, Corpus Christi, Tex.

Examples 1 to 3

An underlayer was made by combining in solution 59.65 parts by weight of JK-67, 15 parts by weight of EUV-5, 10 parts by weight of GP649D99, 15 parts by weight of IR dye A and 0.35 parts by weight of BYK307 in methyl ethyl ketone, 1-methoxypropan-2-ol, butyrolactone and water in a ratio of 65:15:10:10 (w:w). This solution was coated onto substrate A using a wire wound bar. The resulting element was dried at 135° C. for 35 seconds. The coating weight of the resulting first layer was 1.3 $gm^{-2}$.

To make Polymeric Materials A, B and C as used in the top layer, N-13 solution (181.5 g, 0.5 mol), acetone (150 g), di-t-butyldicarbonate (in the amount according to Table 1), potassium carbonate (in the amount according to Table 1) and 18-crown-6 (2.0 g) were added to a flask equipped with a stirrer. The mixture was stirred for two hours at room temperature, and then isolated by precipitating it into copious amounts of water. The product was dried for two days at 50° C.

TABLE 1

Amounts of Di-t-butyldicarbonate and Potassium Carbonate for Polymeric Materials A, B and C.

| | Di-t-butyldicarbonate | | Potassium Carbonate | |
|---|---|---|---|---|
| Polymeric Material | Mass/g | Number of Moles | Mass/g | Number of moles |
| A ("10 mol % t-BOC") | 10.91 | 0.05 | 6.96 | 0.05 |
| B ("20 mol % t-BOC") | 21.82 | 0.10 | 13.92 | 0.10 |
| C ("30 mol % t-BOC") | 32.74 | 0.15 | 20.88 | 0.15 |

Polymeric Material A was a hydroxyl group-containing polymer, N-13, with about 10 mol % of the hydroxyl groups functionalized with heat-labile moieties, tert-butoxycarbonyl ("t-BOC") groups. Polymeric Material B was N-13 with about 20 mol % of the hydroxyl groups functionalized with t-BOC groups. Polymeric Material C was N-13 with about 30 mol % of the hydroxyl groups functionalized with t-BOC groups.

The top layer used in the plate of Example 1 was made by combining in solution Polymeric Material A, with Ethyl Violet and BYK 307 in amounts according to Table 2 in 1-methoxy-2-propyl acetate and DEK in a weight to weight ratio of 8:92. This solution was coated onto the underlayer using a wire wound bar. The coating weight of the resulting top layer was 0.9 $gm^{-2}$. The resulting plate was dried at 135° C. for 35 seconds. This process was repeated with Polymeric Material B to make the top layer used in Example 2 and Polymeric Material C to make the top layer used in Example 3.

TABLE 2

Components and Amounts of the Top Layer in Examples 1–3

| | Example | | |
|---|---|---|---|
| | 1 | 2 | 3 |
| Component | Parts by Weight | | |
| Polymeric Material A ("20 mol % t-BOC") | 99.35 | | |
| Polymeric Material B ("20 mol % t-BOC") | | 99.35 | |
| Polymeric Material C ("30 mol % t-BOC") | | | 99.35 |
| Ethyl Violet | 0.3 | 0.3 | 0.3 |
| BYK307 | 0.35 | 0.35 | 0.35 |

Comparative Examples C4–C5

The underlayer was made according to Examples 1–3.

The top layer was made by combining in solution 99.35 wt % TN-13 (C4) or N-13 (CS) with 0.3 wt % Ethyl Violet and 0.35 wt % BYK 307 in 1-methoxy-2-propyl acetate and DEK in a ratio of 8:92 (w:w). This solution was coated onto the underlayer using a wire wound bar. The coating weight of the resulting underlayer was 0.9 $gm^{-2}$. Each resulting imageable element was dried at 135° C. for 35 seconds.

The plates from Examples 1–3 and C4–C5 were subjected to the Goldstar developer drop test. A large drop of developer was placed on each plate at 22° C. and the time required to dissolve the layers was noted. The results are shown in Table 3.

TABLE 3

Results of the Goldstar Drop Test for Examples 1–3 and C4–C5

| Example | Time for Goldstar developer to dissolve layers (seconds) |
|---|---|
| 1 | 120 |
| 2 | 210 |
| 3 | 210 |
| C4 | 210 |
| C5 | 30 |

The plates of Examples 1–3 and C4–C5 were also subjected to the T-183 drop test. A large drop of T-183 developer was placed on each plate at 22° C. and the time required to dissolve the layers was noted. The results are shown in Table 4.

TABLE 4

Results of the T-183 Drop Test for Examples 1–3 and C4–C5

| Example | Time for T-183 developer to dissolve layers (seconds) |
|---|---|
| 1 | 120 |
| 2 | 180 |
| 3 | 180 |
| C4 | 180 |
| C5 | 30 |

The plates were also tested to determine the minimum level of energy at which the exposed portions dissolve in developer, and the minimum level of energy at which each plate provided its best resolution. To perform each of these tests, each plate was imagewise exposed with 830 nm radiation with an internal test pattern (plot 0), on a Creo Trendsetter 3230, a commercially available platesetter using Procom Plus software, at 140, 127, 116, 107, 99, 92, 86 and 83 mJ/cm$^2$, (at 9 W) and operated at a wavelength of 830 nm (Creo Products, Burnaby, BC, Canada). The plates were then machine processed with Goldstar developer in a Kodak Polychrome Graphics Mercury Mark V Processor (750 mm min$^{-1}$ processing speed, 23° C. developer temperature). To determine the minimum exposure for cleanout and best resolution, the plates were visually inspected to determine the quality of each plate exposed at different energy levels. The minimum exposure for cleanout was the lowest energy level that resulted in no visible polymeric coating in the exposed areas after development. The minimum exposure for best resolution is the lowest energy that visually provided the most suitable solution of an image after development. The results of these tests are shown in Table 5.

TABLE 5

Results of Minimum Exposure for Cleanout and Minimum Exposure for Best Resolution tests for Examples 1–3 and C4–C5

| Example | Minimum exposure energy for cleanout (mJcm$^{-2}$) | Minimum exposure energy for best resolution (mJcm$^{-2}$) |
|---|---|---|
| 1 | 99 | 116 |
| 2 | 99 | 116 |
| 3 | 99 | 116 |
| C4 | 107 | 116 |
| C5 | 83 | 83 |

Example 6

The underlayer was made by combining in solution 59.65 wt % JK-67, 15 wt % EUV-5, 10 wt % GP649D99, 15 wt % IR dye A and 0.35 wt % BYK307 in methyl ethyl ketone, 1-methoxypropan-2-ol, butyrolactone and water in a ratio of 65:15:10:10 (w:w). This solution was coated onto substrate A using a wire wound bar. The resulting plate was dried at 135° C. for 35 seconds. The coating weight of the resulting underlayer was 1.3 gm$^{-2}$.

To make Polymeric Material D as used in the top layer, PHS (59.9 g, 0.5 mol), acetone (271.6 g), di-t-butyldicarbonate (32.74 g, 0.15 mol), potassium carbonate (20.88 g, 0.15 mol) and 18-crown-6 (2.0 g) was added to a flask equipped with a stirrer. The mixture was stirred for two hours at room temperature, and then isolated by precipitating it into copious amounts of water. The product was dried for two days at 50° C.

Polymeric Material D was a hydroxyl group-containing polymer, PHS, with about 30 mol % of the hydroxyl groups functionalized with t-BOC groups.

The top layer for Example 6 was made by combining in solution Polymeric Material D, with Ethyl Violet and BYK 307 in amounts according to Table 6 in 1-methoxy-2-propyl acetate and DEK in a ratio of 8:92 (w:w). This solution was coated onto the underlayer using a wire wound bar. The coating weight of the resulting underlayer was 0.9 gm$^{-2}$. The resulting plate was dried at 135° C. for 35 seconds.

The top layer was made by combining in solution PHS, Ethyl Violet and BYK307 in the amounts according to Table 6 in 1-methoxy-2-propyl acetate and DEK in a of 8:92 (w:w).

Example C7

The underlayer was made according to Example 6.

The top layer was made by combining in solution PHS with Ethyl Violet and BYK307 in the amounts according to Table 6 in 1-methoxy-2-propyl acetate and DEK in a ratio of 8:92 (w:w). This mixture was coated onto the first layer, using a wire wound bar. The coating weight of the resulting top layer was 0.9 gm$^{-2}$. The resulting plate was dried at 135° C. for 35 seconds.

TABLE 6

Components of the Top Layer for Examples 6 and C7

| Component | Example 6 | Example C7 |
|---|---|---|
| | Parts by Weight | |
| Polymeric material D ("30 mol % t-BOC") | 99.35 | |
| PHS | | 99.35 |
| Ethyl Violet | 0.3 | 0.3 |
| BYK307 | 0.35 | 0.35 |

The plates from Examples 6 and C7 were subjected to the Goldstar developer drop test. A large drop of developer was placed on each plate at 22° C. and the time required to dissolve the layers is noted in Table 7.

TABLE 7

Results of Goldstar Drop Test for Examples 6 and C7

| Example | Time for Goldstar developer to dissolve layers (seconds) |
|---|---|
| 6 | 30 |
| C7 | 0 |

The plates from Examples 6 and C7 were tested to determine the minimum level of imaging exposure at which each plate coating completely washes away. To perform these tests, each plate was imagewise exposed with 830 nm radiation with an internal test pattern (plot 0), on a Creo 3230 Trendsetter at 140, 127, 116, 107, 99, 92, 86 and 83 mJ/cm$^2$, (at 9 W). The Creo Trendsetter 3230 is a commercially available platesetter, using Procom Plus software and operating at a wavelength of 830 nm (Creo Products, Burnaby, BC, Canada). The plates were then machine processed with Goldstar developer in a Kodak Polychrome Graphics Mercury Mark V Processor (750 mm min$^{-1}$ processing speed, 23° C. developer temperature). The results of these tests are shown in Table 8.

TABLE 8

Results of Minimum exposure for Cleanout test for Examples 6 and C7.

| Example | Minimum exposure energy for cleanout (mJcm$^{-2}$) |
|---|---|
| 6 | 83 |
| C7 | 0 |

Examples 8–10

The underlayer was made by combining in solution 55.65 wt % JK-67, 18 wt % RAR-62, 11 wt % GP649D99, 15 wt % IR dye A, and 0.35 wt % BYK307 in methyl ethyl ketone, 1-methoxypropan-2-ol, butyrolactone and water in a ratio of 65:15:10:10 (w:w). This solution was coated onto substrate A using a wire wound bar. The resulting element was dried at 135° C. for 35 seconds. The coating weight of the resulting underlayer was 1.3 $gm^{-2}$.

The top layer for Example 8 was made by combining in solution Polymeric Material A, with Ethyl Violet and BYK 307 in amounts according to Table 9 in 1-methoxy-2-propyl acetate and DEK in a ratio of 8:92 (w:w). This solution was coated onto the underlayer using a wire wound bar. The coating weight of the resulting top layer was 0.9 $gm^{-2}$. The resulting plate was dried at 135° C. for 35 seconds. This process was repeated with Polymeric Material B to make the top layer used in Example 9 and Polymeric Material C to make the top layer used in Example 10.

Example C11

The underlayer was provided according to Examples 8–10.

The top layer was made by combining in solution 99.35 wt % TN-13, 0.3 wt % Ethyl Violet, and 0.35 wt % BYK307 in 1-methoxy-2-propyl acetate and DEK in a ratio of 8:92 (w:w). This solution was coated onto the underlayer using a wire wound bar. The coating weight of the resulting top layer was 0.9 $gm^{-2}$. Each resulting plate was dried at 135° C. for 35 seconds.

TABLE 9

Components of the Top Layer in Examples 8–10 and C11

| Component | Example 8 | 9 | 10 | C11 |
|---|---|---|---|---|
| | Parts by Weight | | | |
| Polymeric Material A ("10 mol % t-BOC") | 99.35 | | | |
| Polymeric Material B ("20 mol % t-BOC") | | 99.35 | | |
| Polymeric Material C ("30 mol % t-BOC") | | | 99.35 | |
| TN-13 | | | | 99.35 |
| Ethyl Violet | 0.3 | 0.3 | 0.3 | 0.3 |
| BYK307 | 0.35 | 0.35 | 0.35 | 0.35 |

The plates from examples 8–10 and C11 were subjected to the T-183 developer drop test. A large drop of developer was placed on each plate at 22° C. and the time required to dissolve the layers was noted. The results are shown in Table 10.

The plates were also tested to determine the minimum level of imaging exposure at which each plate coating completely washes away, the minimum level of energy at which each plate provides its best resolution, and the minimum level of energy at which each plate successfully reproduced 1 micron thick horizontal and vertical pixel lines. For these experiments, each plate was imagewise exposed using an internal test pattern, on a Platerite 4300 at 1000 rpm and laser power percentages from 72 to 94, in increments of 2 (corresponding to 115, 119, 122, 125, 128, 132, 135, 138, 141, 144, 148 and 151 $mJcm^{-2}$). The Screen Platerite 4300 is a commercially available platesetter (Screen, Rolling Meadows, Chicago, Ill.). The samples were then machine processed with T-183 developer in a Kodak Polychrome Graphics Mercury Mark V Processor (750 mm $min^{-1}$ processing speed, 23° C. developer temperature). To determine the minimum exposure for cleanout, best resolution, and reproduction of 1 micron pixel lines, the plates were visually inspected to determine the quality of each plate exposed at different energy levels. The minimum exposure for cleanout was the lowest energy level that resulted in no visible polymeric coating in the exposed areas after development. The minimum exposure for best resolution is the lowest energy that visually provided the most suitable resolution of an image after development. The minimum exposure to reproduce 1 micron pixel lines is the lowest energy level that resulted in a suitable reproduction of a 1 micron pixel line on the plate. The results are shown in Table 10.

TABLE 10

Results of tests on Examples 9–10 and C11

| Example | Time for T-183 developer to dissolve layers (seconds) | Minimum exposure energy for cleanout ($mJcm^{-2}$) | Minimum exposure energy for best resolution ($mJcm^{-2}$) | Minimum exposure to reproduce 1 micron pixel lines ($mJcm^{-2}$) Vertical | Horizontal |
|---|---|---|---|---|---|
| 8 | 100 | <122 | 132 | 122 | 132 |
| 9 | 120 | <115 | 122 | <115 | 125 |
| 10 | 150 | 115 | 128 | <115 | 125 |
| C11 | 150 | <122 | 135 | 132 | 141 |

These tests indicate that plates containing polymers functionalized with t-BOC groups, that is the plates in examples 1–3, 6, and 8–10, show a beneficial combination of developer resistance and imaging properties.

The invention claimed is :

1. A positive working imageable element comprising:

a substrate;

a first layer disposed on a portion of the substrate comprising a polymeric material; and a second layer disposed on the first layer comprising a hydroxyl group-containing polymer that includes from 5 mol % to 50 mol % of the hydroxyl groups functionalized with a heat-labile moiety represented by the formula:

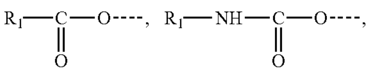

or

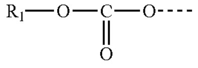

wherein $R_1$ is an alkyl group, an arylalkyl group, an aryl group, an alkenyl group or a silyl group, with the remaining hydroxyl groups being free of said heat-labile moieties.

2. The element of claim 1, wherein the heat-labile moiety is represented by the formula $R_1$—NH—C(O)—O- or $R_1$—O—C(O)—O—.

3. The element of claim 1, wherein the substrate comprises grained aluminum, anodized aluminum, or grained and anodized aluminum.

4. The element of claim 1, wherein the first layer comprises a copolymer including units of N-phenylmaleimide, methacrylic acid or methacrylamide.

5. The element of claim 1, wherein the first layer comprises a copolymer including units of N-phenylmaleimide, methacrylamide, acrylonitrile, and a moiety represented by the formula:

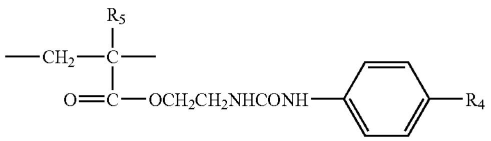

or

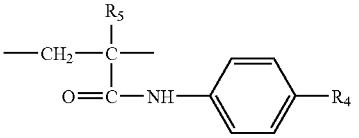

or units of both moieties;

and wherein $R_4$ is OH, COOH, or $SO_2NH_2$, and $R_5$ is hydrogen, halogen or a $C_1$–$C_{12}$ alkyl group.

6. The element of claim 1, wherein the first layer comprises a first copolymer including units of N-phenylmaleimide, methacrylamide and methacrylic acid, and a second copolymer including units of N-phenylmaleimide, methacrylamide, acrylonitrile and a moiety represented by the formula:

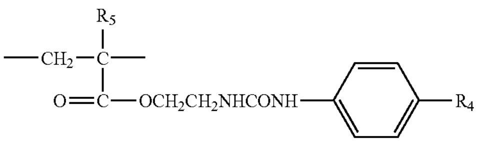

or

-continued

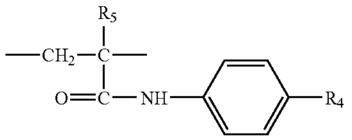

or units of both moieties, and wherein $R_4$ is OH, COOH, or $SO_2NH_2$, and $R_5$ is hydrogen, halogen or a $G_1$–C12 alkyl group.

7. The element of claim 1, wherein the first layer comprises a resin having activated methylol or activated alkylated methylol groups.

8. The element of claim 7, wherein the resin comprises a resole resin.

9. The element of claim 1, wherein the first layer comprises a radiation absorbing compound.

10. The element of claim 9, wherein the radiation absorbing compound is an infrared radiation absorbing material.

11. The element of claim 10, wherein the infrared radiation absorbing compound is a dye or a pigment.

12. The element of claim 1, wherein the second layer comprises a radiation absorbing compound.

13. The element of claim 1, wherein the hydroxyl group-containing polymer is a phenolic resin or a copolymer or derivative thereof.

14. The element of claim 1, wherein the hydroxyl group-containing polymer is a novolak resin.

15. The element of claim 1, wherein the heat-labile moiety comprises a pendant group on the hydroxyl group-containing polymer.

16. The element of claim 1, wherein $R_1$ comprises:

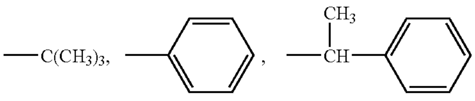

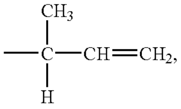

or

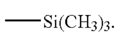

17. The element of claim 1, wherein $R_1$ is $C(CH_3)_3$.

18. The element of claim 1, wherein the hydroxyl group-containing polymer comprises units of:

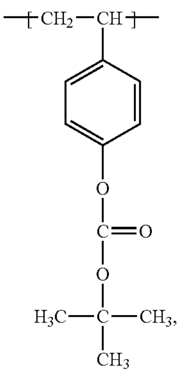

-continued

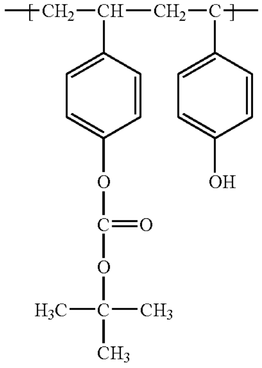

or

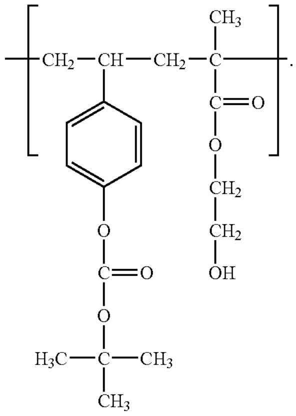

19. The element of claim 1, wherein the hydroxyl group-containing polymer includes 10 mol % to 30 mol % of the hydroxyl groups being functionalized with the heat-labile moiety.

20. The element of claim 1, wherein the imageable element comprises a printing plate precursor, an electronic part precursor or a mask precursor.

21. A method of forming a printing plate precursor comprising:

providing a substrate;

applying onto the substrate a first layer comprising a polymeric material and a radiation absorbing compound; and applying onto the first layer a second layer that comprises a hydroxyl group-containing polymer that includes from 5 mol % to 50 mol % of the hydroxyl groups functionalized with a heat-labile moiety having the formula:

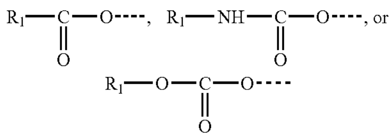

wherein $R_1$ is an alkyl group, an arylalkyl group, an aryl group, an alkenyl group or a silyl group with the remaining hydroxyl groups being free of said heat-labile moieties.

22. The method of claim 21, further comprising:

imagewise exposing the precursor to radiation such that exposed portions of the second layer are more developable in an alkaline developer liquid than unexposed portions; and developing the precursor to form an image.

23. A positive working imageable element comprising:

a substrate;

a first layer disposed on a portion of the substrate comprising a polymeric material and a radiation absorbing compound; and a second layer disposed on the first layer that is substantially free of the radiation absorbing compound and comprising a hydroxyl group-containing polymer that includes from 5 mol% to 50 mol% of the hydroxyl groups functionalized with a heat-labile moiety represented by the formula:

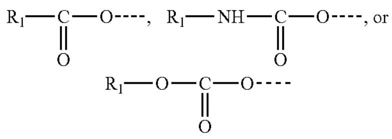

wherein $R_1$ is an alkyl group, an arylalkyl group, an aryl group, an alkenyl group or a silyl group with the remaining hydroxyl groups being free of said heat-labile moieties.

* * * * *

UNITED STATES PATENT AND TRADEMARK OFFICE

CERTIFICATE OF CORRECTION

PATENT NO. : 7,163,777 B2
APPLICATION NO. : 10/802533
DATED : January 16, 2007
INVENTOR(S) : Kevin B. Ray et al.

It is certified that error appears in the above-identified patent and that said Letters Patent is hereby corrected as shown below:

| | |
|---|---|
| Column 22, line 12 | In Claim 6, delete "G1–C12" and insert -- C1–C12 --, therefor. |
| Column 24, lines 3-4 | In Claim 21, after "includes" delete "from 5 mol % to 50 mol % of the hydroxyl groups functionalized with". |
| Column 24, lines 15-17 | In Claim 21, after "silyl group" delete "with the remaining hydroxyl groups being free of said heat-labile moieties". |
| Column 24, lines 32-33 | In Claim 23, after "includes" delete "from 5 mol % to 50 mol % of the hydroxyl groups functionalized with". |
| Column 24, lines 44-46 | In Claim 23, after "silyl group" delete "with the remaining hydroxyl groups being free of said heat-labile moieties". |

Signed and Sealed this

Thirtieth Day of October, 2007

JON W. DUDAS

*Director of the United States Patent and Trademark Office*